United States Patent
Huang et al.

(10) Patent No.: US 11,839,059 B2
(45) Date of Patent: Dec. 5, 2023

(54) HEAT DISSIPATION DEVICE

(71) Applicant: AAC Technologies Pte. Ltd., Singapore (SG)

(72) Inventors: Xingzhi Huang, Shenzhen (CN); Lin Liu, Shenzhen (CN); Dijiang Tong, Shenzhen (CN); Zhe Zhang, Shenzhen (CN); Jun Wu, Shenzhen (CN); Zhichen Chen, Shenzhen (CN); Zhaoyu Yin, Shenzhen (CN)

(73) Assignee: AAC Technologies Pte. Ltd., Singapore (SG)

( * ) Notice: Subject to any disclaimer, the term of this patent is extended or adjusted under 35 U.S.C. 154(b) by 784 days.

(21) Appl. No.: 16/992,142

(22) Filed: Aug. 13, 2020

(65) Prior Publication Data

US 2021/0029850 A1    Jan. 28, 2021

Related U.S. Application Data

(63) Continuation of application No. PCT/CN2019/097759, filed on Jul. 25, 2019.

(30) Foreign Application Priority Data

Jul. 22, 2019 (CN) .......................... 201921159898.1

(51) Int. Cl.
*H05K 7/20* (2006.01)
*H04M 1/02* (2006.01)

(52) U.S. Cl.
CPC ...... *H05K 7/20445* (2013.01); *H04M 1/0202* (2013.01); *H05K 7/20218* (2013.01)

(58) Field of Classification Search
CPC combination set(s) only.
See application file for complete search history.

(56) References Cited

U.S. PATENT DOCUMENTS

| | | | | |
|---|---|---|---|---|
| 7,518,860 B2* | 4/2009 | Chin | ......................... | G06F 1/20 |
| | | | | 361/679.55 |
| 10,377,000 B2* | 8/2019 | Siahaan | ................ | G06F 1/1626 |
| 11,013,150 B2* | 5/2021 | Kim | ................... | H05K 7/20454 |
| 11,016,546 B2* | 5/2021 | Li | ......................... | H04M 1/026 |
| 11,368,770 B2* | 6/2022 | Huang | ................... | H04R 9/022 |
| 11,375,301 B2* | 6/2022 | Huang | ..................... | H04R 1/02 |
| 11,375,302 B2* | 6/2022 | Huang | ..................... | H04R 1/02 |
| 2008/0087329 A1* | 4/2008 | Chin | ..................... | F04D 29/582 |
| | | | | 137/338 |

(Continued)

*Primary Examiner* — Lisa Lea-Edmonds
(74) *Attorney, Agent, or Firm* — W&G Law Group

(57) ABSTRACT

The present invention provides a heat dissipation device having a speaker box, a heating element and a heat conductor. The speaker box includes a housing having sound outlet hole and a speaker unit housed in the housing. The speaker unit includes a diaphragm. The heat conductor includes a first heat conductor and a second heat conductor; the first heat conductor includes a heat conductive part, a heat conductive part, and an extensional heat conductive part. The second heat conductor is connected to the extensional heat conductive part at one end and to the heating element at the other end. The heat conductor of the present invention introduces the heat generated by the heating element into the front cavity and transfers the heat through the air in the front cavity to the outside of the sound outlet hole, with a high heat dissipation efficiency.

13 Claims, 4 Drawing Sheets

(56) References Cited

U.S. PATENT DOCUMENTS

| | | | |
|---|---|---|---|
| 2013/0259284 A1* | 10/2013 | Shi | H04R 1/023 |
| | | | 381/335 |
| 2015/0119111 A1* | 4/2015 | Honmura | F28D 15/046 |
| | | | 455/566 |
| 2017/0064869 A1* | 3/2017 | Siahaan | H04M 1/02 |
| 2017/0155746 A1* | 6/2017 | Yang | G06F 1/203 |
| 2020/0060043 A1* | 2/2020 | Lee | H04M 1/0266 |
| 2021/0029426 A1* | 1/2021 | Huang | H04R 9/022 |
| 2021/0029427 A1* | 1/2021 | Huang | H04R 1/02 |
| 2021/0029428 A1* | 1/2021 | Huang | H04R 9/022 |
| 2021/0029429 A1* | 1/2021 | Huang | H04R 7/04 |
| 2021/0029457 A1* | 1/2021 | Huang | H04R 9/022 |
| 2021/0029458 A1* | 1/2021 | Huang | H04R 9/022 |
| 2021/0029459 A1* | 1/2021 | Huang | H04R 9/022 |
| 2021/0029460 A1* | 1/2021 | Huang | H04R 9/06 |
| 2021/0029461 A1* | 1/2021 | Huang | H04R 31/00 |
| 2021/0029462 A1* | 1/2021 | Huang | H05K 7/20127 |

* cited by examiner

HEAT DISSIPATION DEVICE

FIELD OF THE PRESENT DISCLOSURE

The present invention relates to the technical field of heat dissipation, and more particularly to a mobile terminal with heat dissipation function.

DESCRIPTION OF RELATED ART

The communication industry has always maintained a high degree of concern about the heat dissipation of heat dissipation devices such as mobile phones, which contain various components that will heat up during operation, generally through the housing of the whole machine, such as metal shells. This will place requirements on the housing material that will affect the circuit layout or antenna performance.

SUMMARY OF THE INVENTION

One of the main objects of the invention is to provide a heat dissipation device with improved heat dissipation efficiency.

Accordingly, the present invention provides a heat dissipation device, comprising: a speaker box having a housing with a plurality of sound outlet holes and a speaker unit received in an accommodation space of the housing; a heating element having a heat conductor connected between the speaker box and the heating element. The speaker unit comprises a diaphragm separating the accommodation space into a front cavity and a back cavity. The front cavity is communicated with the outside via the sound outlet hole. The housing includes a first through hole communicated with the front cavity and a second through hole communicated with the back cavity. The heat conductor comprises a first heat conductor fixed with the housing and a second heat conductor connected between the first heat conductor and the heating element. The heat conductor introduces the heat generated by the heating element into the front cavity and transfers the heat through the air in the front cavity to the outside of the sound outlet hole. The first heat conductor comprises a heat conductive part of front cavity embedded in the housing and correspondingly covering the first through hole, a heat conductive part of back cavity extending from the heat conductive part of front cavity and covering the second through hole, and a extensional heat conductive part extending from the heat conductive part of back cavity edge to the outside of the housing. One end of the second heating conductor is connected with the extensional heat conductive part, and the other end is connected with the heating element.

Further, the housing comprises a top wall that is directly facing and spaced from the diaphragm, a bottom wall opposite to the top wall and a side wall bending and extending from the edge of the top wall toward the bottom wall, and the first through hole and the second through hole are arranged spaced apart in the top wall.

Further, the housing further comprises a support wall extending from the top wall to within the accommodation space, the speaker unit is fixed with the support wall and arranged spaced with respect to the top wall, and the support wall is spaced apart between the front cavity and the back cavity.

Further, the sound outlet hole is formed at the side wall, a front acoustic cavity is formed by a spacing between the diaphragm and the top wall directly facing the diaphragm, the housing is formed with a sound channel connecting the front acoustic cavity and the sound outlet hole, and the front cavity comprises the front acoustic cavity and the sound channel.

Further, the housing further comprises a separation wall that separates the sound channel from the back cavity, the separation wall extends from a side of the speaker unit near the sound outlet hole toward the side wall, the separation wall, the top wall and the side wall encloses to form the sound channel.

Further, the heat conductive part of front cavity comprises a main body part directly facing the diaphragm and a bent part bent from the main body part edge toward the bottom wall and embedded in the housing, the heat conductive part of back cavity is bending and extended from the bent part.

Further, at least a portion of the bent part is embedded in the support wall.

Further, the main body part and the heat conductive part of back cavity are both plate-shaped, and the first heat conductor is integrally formed.

Further, the heat dissipation device further comprises a housing that secures the speaker box and the heating element, the side wall is correspondingly attached and fixed with the housing, and several sound holes which are communicated with the sound outlet hole correspondingly are arranged through the housing.

Further, the first heat conductor is integrally injection molded with the housing.

Further, at least one of the first heat conductor and the second heat conductor is a solid heat conductor.

Further, at least one of the first heat conductor and the second heat conductor is a heat conduction tube with a cooling liquid inside.

Further, the extensional heat conductive part is connected to the second heat conductor by welding.

BRIEF DESCRIPTION OF THE DRAWINGS

Many aspects of the exemplary embodiment can be better understood with reference to the following drawings. The components in the drawing are not necessarily drawn to scale, the emphasis instead being placed upon clearly illustrating the principles of the present disclosure.

DETAILED DESCRIPTION OF THE EXEMPLARY EMBODIMENT

Figure 1:
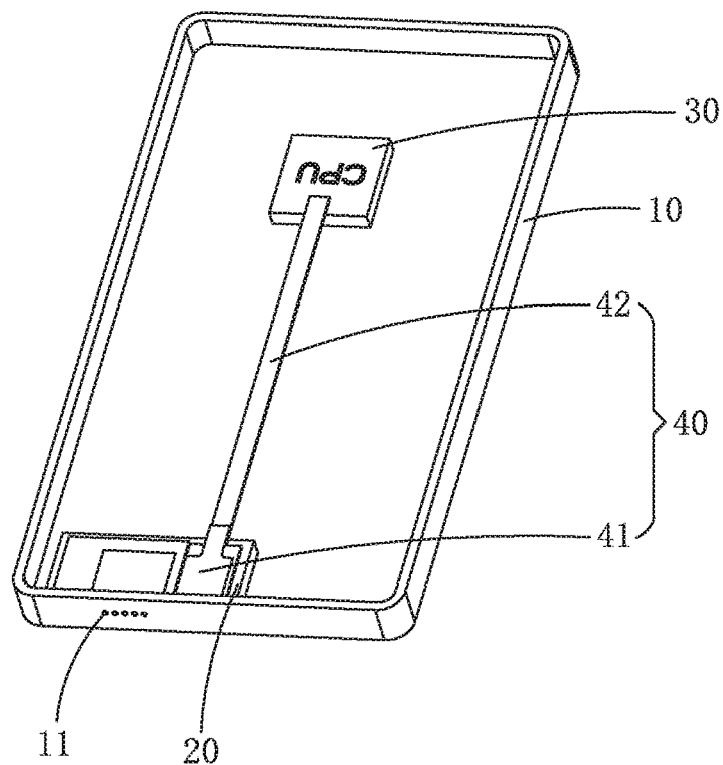
FIG. 1 is an isometric view of a heat dissipation device provided by an embodiment of the present invention.

The present disclosure will hereinafter be described in claim detail with reference to an exemplary embodiment. To make the technical problems to be solved, technical solutions and beneficial effects of the present disclosure more apparent, the present disclosure is described in claim further detail together with the figure and the embodiment. It should be understood the specific embodiment described hereby is only to explain the disclosure, not intended to limit the disclosure.

It should be noted that all the directional indications (such as upper, lower, inner, outer, top part, bottom part, etc.) in the embodiment of the present invention are only used to explain the relative position relationship among the components under a certain specific posture (as shown in the accompanying drawings); if such certain specific posture is changed, the directional indication is changed accordingly.

It should also be noted that when an element is referred to as being "fixed" or "disposed" on another element, the element may be directly on the other element or there may be intervening elements at the same time. When an element is called "connected" to another element, it may be directly connected to the other element or there may be intervening elements at the same time.

Referring to FIGS. 1-7, the embodiment of the present invention provides a heat dissipation device. The heat dissipation device comprises a housing 10, a speaker box 20, a heating element 30, and a heat conductor 40 connected between the speaker box 20 and the heating element 30. The speaker box 20, the heat conductor 40 and the heating element 30 are all fixed in the housing 10, and the heat generated in the heating element 30 can be introduced into the speaker box 20 by the heat conductor 40, then discharged to the outside of the housing 10 by the speaker box 20 continuously. The heating element 30 in the embodiment can be the CPU or the battery of the mobile phone or any component in the mobile phone which needs heat dissipation.

Referring to FIGS. 3-6, the speaker box 20 comprises a housing 21 having sound outlet holes 211 and a speaker unit 25 housed in the housing 21. The housing 21 encloses to form an accommodation space 22 for accommodating the speaker unit 25, and the sound outlet hole 211 is provided through on the housing 21. The speaker unit 25 comprises a diaphragm 251, the diaphragm 251 separates the accommodation space 22 into a front cavity 23 and a back cavity 24, and heat is concentrated in the front cavity 23 region. The diaphragm 251 can generate high-speed airflow in the area of front cavity 23 when in operation, and has excellent air cooling effect. A plurality of sound holes 11 communicated with the sound outlet hole 211 correspondingly is arranged through on the housing 10, and the front cavity 23 is communicated with the outside through the sound outlet holes 211 and the sound holes 11.

Figure 2:
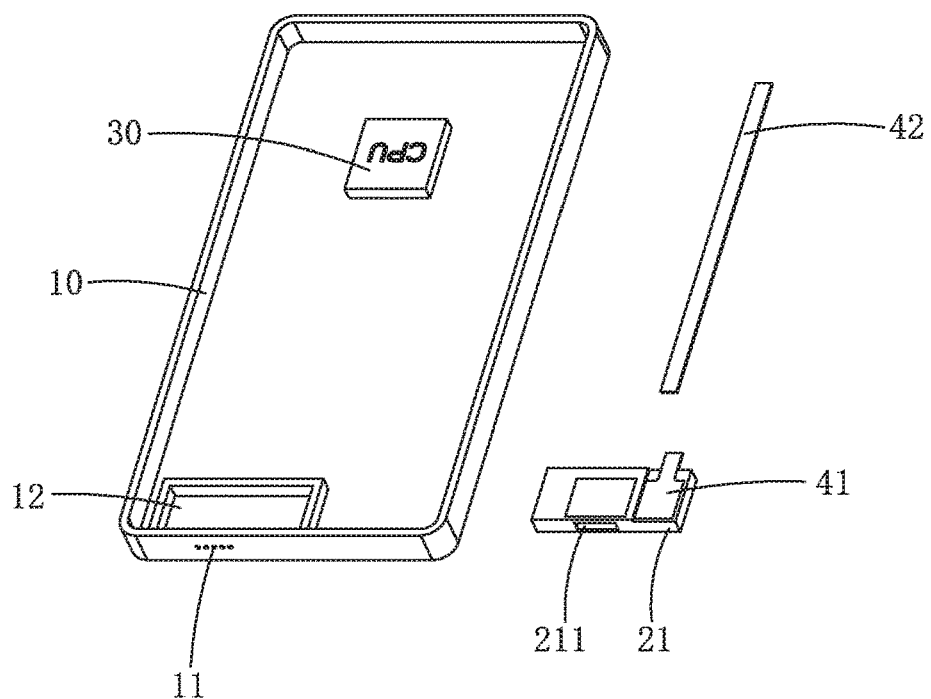
FIG. 2 is an exploded view of the heat dissipation device in FIG. 1.
Figure 3:
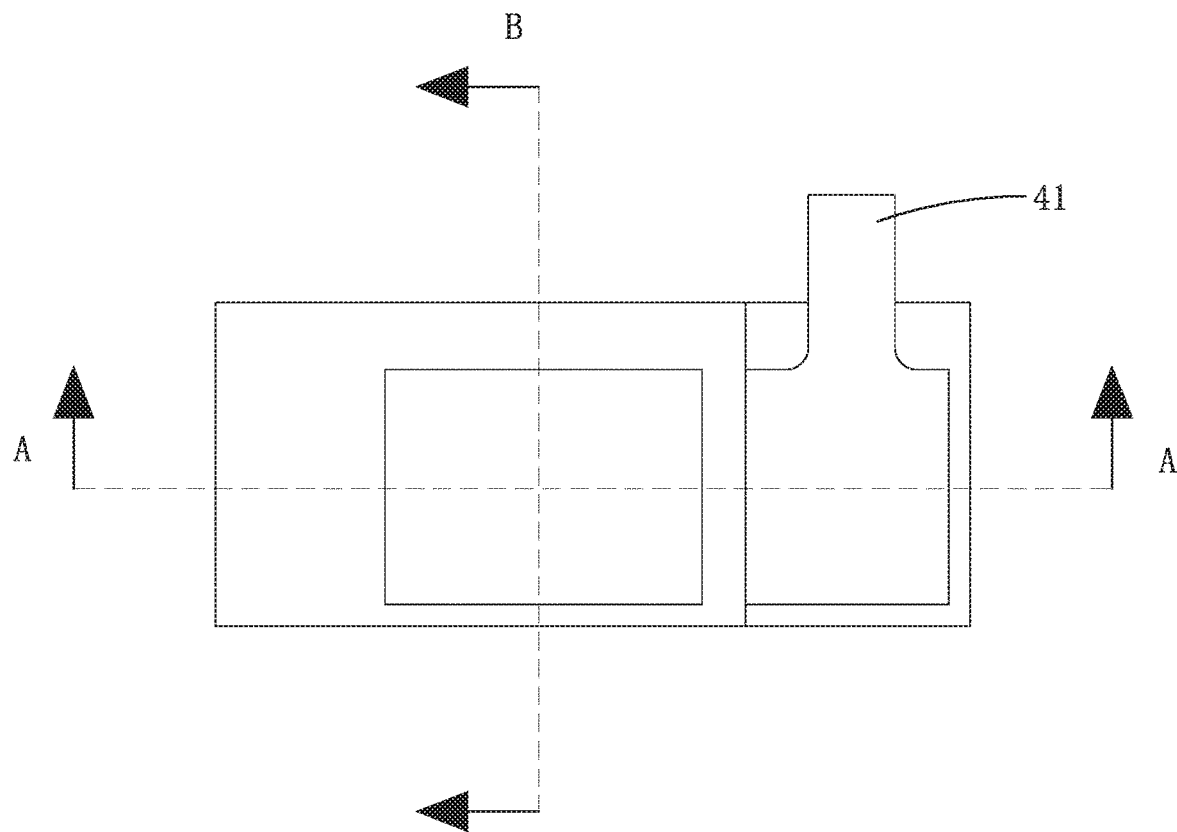
FIG. 3 is a top view of a first heat conductor and a speaker box provided by the embodiment of the present.
Figure 4:
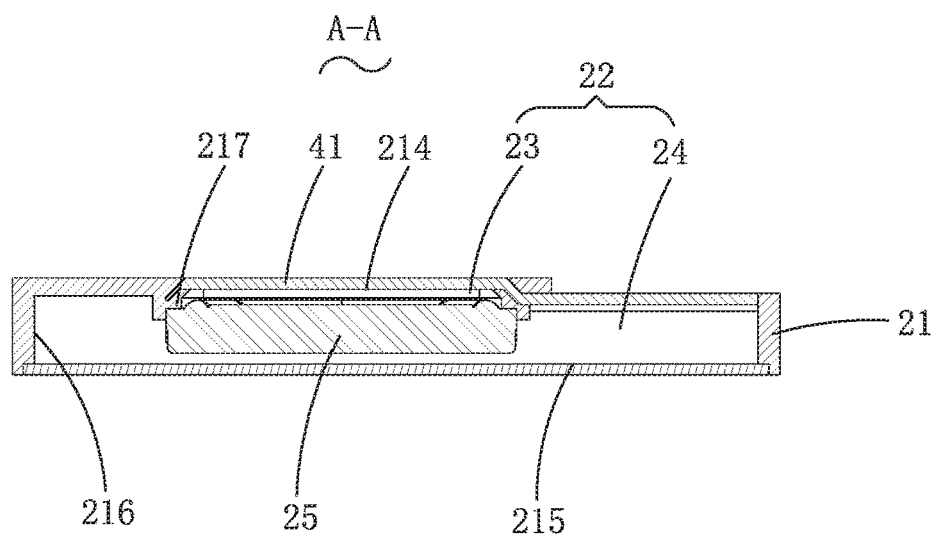
FIG. 4 is a cross-sectional view taken along line A-A in FIG. 3.
Figure 5:
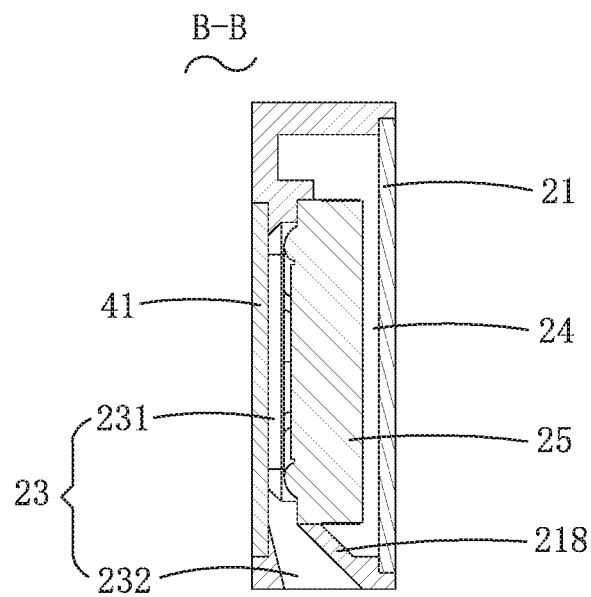
FIG. 5 is a across-sectional view taken along line B-B in FIG. 3.
Figure 6:
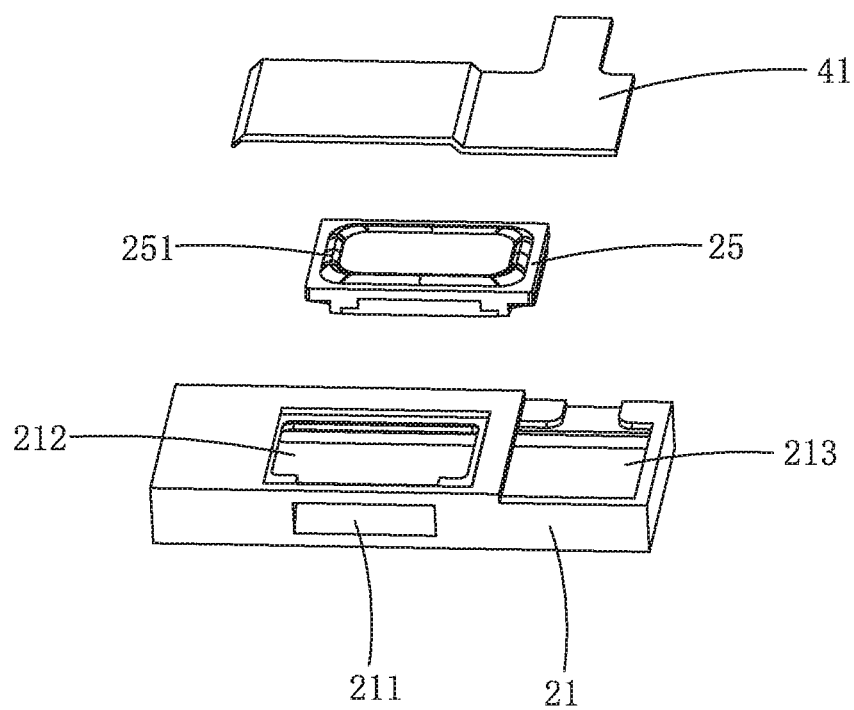
FIG. 6 is an exploded view of the heat dissipation device in FIG. 3.

Referring further to FIGS. 1 and 2, the heat conductor 40 comprises a first heat conductor 41 and a second heat conductor 42 connected between the first heat conductor 41 and the heating element 30. The first heat conductor 41 is fixedly connected to the housing 21. Preferably, the first heat conductor 41 is injection molded integrally with the housing 21, and the heat conductor 40 introduces the heat generated by the heating element 30 into the front cavity 23. The diaphragm 251 on the speaker unit 25 transfers heat through the air in front cavity 23 via the sound outlet holes 211 and the sound holes 11 to the outside of the housing 10 for convection with the outside air.

Figure 7:
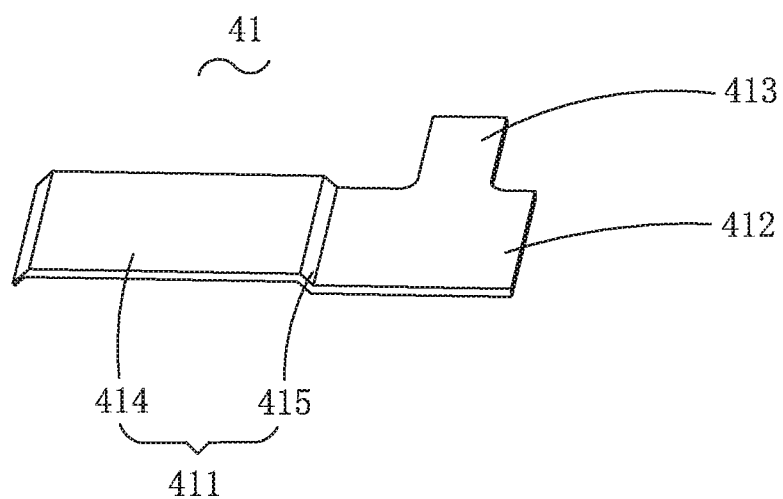
FIG. 7 is an isometric view of the first heat conductor of the heat dissipation device.

Referring to FIG. 7, specifically, the housing 21 is provided with a first through hole 212 communicating with the front cavity 23 and a second through hole 213 communicating with the back cavity 24. The first heat conductor 41 comprises a heat conductive part of front cavity 411, a heat conductive part of back cavity 412 and an extensional heat conductive part 413. The heat conductive part of front cavity 411 is embed in the housing 21 and cover the first through hole 212 correspondingly, the heat conductive part of back cavity 412 extend from the heat conductive part of front cavity 411 and covers the second through hole 213. The extensional heat conductive part 413 extend from the edge of the heat conductive part of back cavity 412 to the outside of the housing 21. The first heat conductor 41 can be not only participated in the enclosure for the front cavity 23, but also participated in the formation of back cavity 24.

One end of the second heat conductor 42 is connected to the extensional heat conductive part 413, and the other end of the second heat conductor 42 is connected to the heating element 30. The heat generated by the heating element 30 is transmitted to the extensional heat conductive part 413 via the second heat conductor 42, which is then transmitted to the front cavity 23 via the heat conductive part of back cavity 412 and the heat conductive part of front cavity 411 in sequence. The vibration of the diaphragm 251 transfers heat through the air flow to the outside of the housing 10. Heat generated by the back cavity 24 is also transferred to the front cavity 23 via the heat conductive part of back cavity 412 and the heat conductive part of front cavity 411. As the heat conductor 40 is directly contacted with the front cavity 23, the present invention not only realizes the heat dissipation of the heating element 30 inside the heat dissipation device, but also helps improve the cooling performance of the speaker box 20 with the contact between the heat conductor 40 and the back cavity 24.

The speaker unit 25 in this embodiment can input a pulse signal of lower frequency (less than 1000 Hz) to drive the diaphragm 251 in the speaker unit 25 to vibrate when performing heat dissipation work, pushing the front cavity 23 air flow to form the air cooling effect. The pulse signal can be played separately when the speaker box 20 is not performing a music playing task; the pulse signal may be superimposed into the music signal when performing a music playback task. The signal is an ultra-low frequency pulse signal, which will not be heard by human ears and will not affect the normal listening effect.

In this embodiment, the housing 21 comprises a top wall 214 that is directly facing and spaced from the diaphragm 251, a bottom wall 215 that is opposite to the top wall 214, a side wall 216 that bends and extends from the edge of the top wall 214 toward the bottom wall 215 and a support wall 217 that extends from the top wall 214 into the accommodation space 22. The first through hole 212 and the second through hole 213 are arranged spaced apart on the top wall 214. A support wall 217 is arranged spaced apart between the front cavity 23 and the back cavity 24. The speaker unit 25 is fixed to the support wall 217 and arranged spaced apart from the top wall 214, the diaphragm 251 is located on the top part of the speaker unit 25 and arranged opposite the top wall 214.

As a preferred embodiment, the front cavity 23 comprises a front acoustic cavity 231 and a sound channel 232. Sound outlet holes 211 is formed at the side wall 216, the front acoustic cavity 231 is formed by the spacing between the diaphragm 251 and the top wall 214 directly facing the diaphragm 251. The housing 21 is formed with the sound channel 232 connecting the front acoustic cavity 231 and the sound outlet holes 211, and the housing 10 is provided with a mounting slot 12 on it. The speaker box 20 is installed in the mounting slot 12, the side wall 216 of the housing 21 is attached and fixed to the housing 10, and the front acoustic cavity 231, the sound channel 232, the sound outlet holes 211 and the sound holes 11 are connected in sequence.

As a preferred embodiment, the house 21 also comprises a separation wall 218 that space the sound channel 232 and the back cavity 24, the separation wall 218 extends from the side of the speaker unit 25 near the sound outlet holes 211 toward the side wall 216, and the separation wall 218, the top wall 214 and the side wall 216 form the sound channel 232.

As a preferred embodiment, the heat conductive part of front cavity 411 comprises a main body part 414 directly facing the diaphragm 251 and a bent part 415 bending from the edge of the main body part 414 toward the bottom wall 215 and embedded in the housing 21. The heat conductive part of back cavity 412 bends and extends bent from the bent part 415, and at least a portion of the bent part 415 is embedded in the support wall 217 so as to support the first heat conductor 41. The main body part 414 and the heat conductive part of back cavity part 412 are both plate-shaped, the heat conductive part of front cavity 411 on the first heat conductor 41, the heat conductive part of back cavity 412 and the extensional heat conductive part 413 are integrally formed.

At least one of that first heat conductor 41 and the second heat conductor 42 in the embodiment is a solid heat conductor, and the first heat conductor 41 and the second heat conductor 42 can be fixedly connected by welding or glue; of course, at least one of the first heat conductor 41 and the second heat conductor 42 may also be a heat conducting pipe having a cooling liquid built therein, and in this case, the extensional heat conductive part 413 may be connected with the second heat conductor 42 by welding.

When the heat dissipation device of the present invention is practically used, the two ends of the heat conductor 40 are defined as the input end and the condensing end respectively. The input end of the heat conductor 40 in the mobile phone can be tightly attached onto the heating element 30 such as a CPU, and the condensing end is closely attached to the position of the front cavity 23 of the speaker box 20 or directly put in the high-speed airflow in the front cavity 23, with the heat entering via the input end.

When the heat conductor 40 is a heat conducting tube with a cooling liquid built therein, the cooling liquid at the input end is heated and evaporated, passes through the hollow heat conducting tube and is gradually cooled at a lower temperature condensing end, and is changed from steam to liquid again, then it flows back to the input end from the heat conduction tube, and repeats this process continuously. The heat generated by the heating element 30 is rapidly transferred to the front cavity 23, and the heat in the heat conductor 40 is rapidly exported to the outside air by utilizing the air cooling effect of the speaker unit 25, so as to achieve the effect of liquid cooling and/or air cooling. It will greatly improve the heat dissipation efficiency of heat conductor 40 for fast and effective heat dissipation.

It is to be understood, however, that even though numerous characteristics and advantages of the present exemplary embodiment have been set forth in the foregoing description, together with details of the structures and functions of the embodiment, the disclosure is illustrative only, and changes may be made in detail, especially in matters of shape, size, and arrangement of parts within the principles of the invention to the full extent indicated by the broad general meaning of the terms where the appended claims are expressed.

What is claimed is:
1. A heat dissipation device, comprising:
a speaker box having a housing with a plurality of sound outlet holes and a speaker unit received in an accommodation space of the housing;
a heating element having a heat conductor connected between the speaker box and the heating element; wherein
the speaker unit comprises a diaphragm separating the accommodation space into a front cavity and a back cavity;
the front cavity is communicated with the outside via the sound outlet hole;
the housing includes a first through hole communicated with the front cavity and a second through hole communicated with the back cavity;
the heat conductor comprises a first heat conductor fixed with the housing and a second heat conductor connected between the first heat conductor and the heating element;
the heat conductor introduces the heat generated by the heating element into the front cavity and transfers the heat through the air in the front cavity to the outside of the sound outlet hole;
the first heat conductor comprises a heat conductive part of front cavity embedded in the housing and correspondingly covering the first through hole, a heat conductive part of back cavity extending from the heat conductive part of front cavity and covering the second through hole, and a extensional heat conductive part extending from the heat conductive part of back cavity edge to the outside of the housing;
one end of the second heating conductor is connected with the extensional heat conductive part, and the other end is connected with the heating element.

2. The heat dissipation device as described in claim 1, wherein the housing comprises a top wall that is directly facing and spaced from the diaphragm, a bottom wall opposite to the top wall and a side wall bending and extending from the edge of the top wall toward the bottom wall, and the first through hole and the second through hole are arranged spaced apart in the top wall.

3. The heat dissipation device as described in claim 2, wherein the housing further comprises a support wall extending from the top wall to within the accommodation space, the speaker unit is fixed with the support wall and arranged spaced with respect to the top wall, and the support wall is spaced apart between the front cavity and the back cavity.

4. The heat dissipation device as described in claim 3, wherein the sound outlet hole is formed at the side wall, a front acoustic cavity is formed by a spacing between the diaphragm and the top wall directly facing the diaphragm, the housing is formed with a sound channel connecting the front acoustic cavity and the sound outlet hole, and the front cavity comprises the front acoustic cavity and the sound channel.

5. The heat dissipation device as described in claim 4, wherein the housing further comprises a separation wall that separates the sound channel from the back cavity, the separation wall extends from a side of the speaker unit near the sound outlet hole toward the side wall, the separation wall, the top wall and the side wall encloses to form the sound channel.

6. The heat dissipation device as described in claim 5, wherein the heat conductive part of front cavity comprises a main body part directly facing the diaphragm and a bent part bent from the main body part edge toward the bottom wall and embedded in the housing, the heat conductive part of back cavity is bending and extended from the bent part.

7. The heat dissipation device as described in claim 6, wherein at least a portion of the bent part is embedded in the support wall.

8. The heat dissipation device as described in claim 7, wherein the main body part and the heat conductive part of back cavity are both plate-shaped, and the first heat conductor is integrally formed.

9. The heat dissipation device as described in claim 4, wherein the heat dissipation device further comprises a housing that secures the speaker box and the heating element, the side wall is correspondingly attached and fixed with the housing, and several sound holes which are communicated with the sound outlet hole correspondingly are arranged through the housing.

10. The heat dissipation device as described in claim 1, wherein the first heat conductor is integrally injection molded with the housing.

11. The heat dissipation device as described in claim 1, wherein at least one of the first heat conductor and the second heat conductor is a solid heat conductor.

12. The heat dissipation device as described in claim 1, wherein at least one of the first heat conductor and the second heat conductor is a heat conduction tube with a cooling liquid inside.

13. The heat dissipation device as described in claim 1, wherein the extensional heat conductive part is connected to the second heat conductor by welding.

* * * * *